United States Patent [19]

Higuchi et al.

[11] Patent Number: 4,866,673

[45] Date of Patent: Sep. 12, 1989

[54] BI-MOS SEMICONDUCTOR MEMORY HAVING HIGH SOFT ERROR IMMUNITY

[75] Inventors: Hisayuki Higuchi, Kokubunji; Makoto Suzuki, Hachioji; Noriyuki Homma, Kodaira; Kiyoo Itoh, Higashikurume, all of Japan

[73] Assignee: Hitachi, Ltd., Tokyo, Japan

[21] Appl. No.: 38,940

[22] Filed: Apr. 16, 1987

[30] Foreign Application Priority Data

Apr. 17, 1986 [JP] Japan .................................. 61-89012

[51] Int. Cl.$^4$ .............................................. G11C 7/00
[52] U.S. Cl. ................................ 365/177; 365/203; 365/189.07; 365/230.01; 365/205; 365/155
[58] Field of Search ............... 365/205, 206, 207, 230, 365/233, 227, 190, 154, 241, 155, 156, 181, 177

[56] References Cited

U.S. PATENT DOCUMENTS

| | | | |
|---|---|---|---|
| 4,747,083 | 5/1988 | Nakajima et al. | 365/230 X |
| 4,750,155 | 6/1988 | Hsieh | 365/154 |

FOREIGN PATENT DOCUMENTS

| | | | |
|---|---|---|---|
| 0045215 | 3/1982 | European Pat. Off. | 365/230 |
| 0139196 | 2/1985 | European Pat. Off. | 365/230 |
| 58-142416 | 8/1983 | Japan | 365/154 |

*Primary Examiner*—Stuart N. Hecker
*Assistant Examiner*—Alfonso Garcia
*Attorney, Agent, or Firm*—Antonelli, Terry & Wands

[57] ABSTRACT

A semiconductor memory is provided having high reliability, and which particularly prevents data destruction by α rays, and the like. In a semiconductor memory for detecting memory data from the conduction ratio between a transistor of a flip-flop type memory cell connected to selected word line and data line pairs and a load device of the data line, an arrangement is provided for setting the word line voltage to a voltage lower than the sum of the data line voltage and the threshold voltage of a data transfer MOS transistor of the memory cell. The signal read out from the memory cell is then applied through the data line to a differential amplifier using the base or gate of a junction type transistor as its input. Particularly to set the word line voltage to a voltage lower than the sum of the data line voltage and the threshold voltage of the data transfer MOS transistor of the memory cell, a device having high driving capability such as a bipolar transistor is used as the load of the data line. The word line voltage is changed over to two stages so that the data line voltage $V_D$ and the word line voltage $V_W$ satisfy the relation $V_W < V_D + V_{TH}$ in a read cycle and the relation $V_W > V_D + V_{TH}$ in a write cycle (where $V_{TH}$ is the threshold voltage of NMOS inside the memory cell).

10 Claims, 13 Drawing Sheets

BI-MOS SEMICONDUCTOR MEMORY HAVING HIGH SOFT ERROR IMMUNITY

BACKGROUND OF THE INVENTION

This invention relates generally to a semiconductor memory circuit and more particularly to a semiconductor memory circuit suitable for improving the operation speed of the circuit, immunity to most external disturbance and reliability such as reduction of the soft error rate or higher soft error immunity.

A high speed memory circuit consisting of the combination of an MOS transistor and a bipolar transistor has been proposed in the past (e.g. Japanese Patent Laid-Open No. 129994/1980). In order to improve the operation speed of the circuit, the voltage of a data line pair is level-shifted by the emitter follower of the bipolar transistor and a diode in the memory circuit described above, is then led to a differential amplifier of the bipolar transistor and the memory data of the data line pair is amplified and then sensed. In the memory circuit described above, a plurality of constant current nodes of the differential amplifier are connected to a common constant current source, and the voltage of the data line for reading out the data is set to a higher level than the other data lines from which the data is not read out so that the current supplied from the constant current source is concentrated upon only the differential amplifier connected to the data line having a higher voltage so as to read out the data.

However, the memory circuit disclosed in the prior art reference described above does not take into consideration the influences of the memory cell on the node voltage in conjunction with the relationship between the data line voltage and the word line voltage. In this circuit, the data line voltage is led to the differential amplifier after being level-shifted, but the reference does not take into consideration the circuit arrangement wherein a plurality of emitters of level-shifting emitter followers are connected to a plurality of common constant current sources.

Furthermore, this circuit uses MOS.FET as a load device of the data lines and a data line load is formed at the time of selection and write of data line for reading out the data by ON/OFF of this MOSFET. However, the reference does not take into consideration any load devices other than MOSFET.

As described above, the conventional technique does not consider the change of the node voltage in the memory cell at the time of the read and write operations of the memory cell data, and is not free from the problems of the stable operation of the memory cell, particularly its strength against the data destruction by α rays.

Conventionally, the differential amplifier of sense amplifier is disposed on each data line. According to this circuit arrangement, however, there occurs the problem that storage of the sense amplifier inside a cell pitch of a memory cell matrix is not easy and the occupying area of the sense amplifier increases.

SUMMARY OF THE INVENTION

This invention is concerned with the improving the read and write operations of a semiconductor memory and the improving the circuitry associated with these operations.

The semiconductor memory in accordance with the present invention is characterized in that a word line voltage is set to a level lower than the sum of a data line voltage and a threshold voltage of a data transfer MOS transistor and in that the signal read out from the memory cell through the data line is inputted to a differential amplifier using the base or gate of a junction type transistor as the input.

In the present invention, a device having high drive capability such as a bipolar transistor is used as the load of the data line to accomplish a high circuit operation speed and to rapidly attain recovery from the write state to the read state, and the word line voltage is changed over to two stages in the read cycle in order to shorten the time necessary for the next data read-out. Furthermore, the change of the node voltage of the memory cell is inhibited at the time of read-out of the memory cell data while the difference of the node voltages of the memory cell in the write cycle is sufficiently increased in order to improve α-ray resistance. A plurality of emitters of emitter followers for level-shift are connected in parallel and then connected to the differential amplifier while a switch circuit is disposed in each data line pair so that the amplifier can be shared by ON/OFF of this switch and the occupying area of the sense amplifier can be reduced. When the relationship between the data line voltage $V_D$ and the word line voltage $V_W$ is set so as to satisfy the relation $V_W < V_D + V_{TH}$, one of the two MOSFETs (hereinafter called simply "MOS") for transferring the memory cell data to the data line pair is turned OFF. Therefore, the memory cell node voltage does not substantially alter by the readout of the memory data and the voltage difference of the node pair of the memory cell remains unaltered as before the memory data read-out. When writing the data into the memory cell, the relation is set to $V_W > V_D + V_{TH}$ and under this condition, the voltage difference between the node pair of the memory cell can be increased. In this manner, the soft error rate of the memory cell due to the α rays can be reduced or its soft error immunity to the α rays can be improved by increasing the voltage difference between the memory cell node pair.

It is a first object of the present invention to eliminate the problems of the prior art technique described above.

It is a second object of the present invention to provide a semiconductor memory capable of high speed operation.

It is a third object of the present invention to provide a semiconductor memory having high soft error immunity to radioactive rays, particularly to α rays, or having reduced soft error rate to the α rays.

It is a fourth object of the present invention to provide a semiconductor memory having a small occupying area when a circuit is constituted and eventually, having a small chip area.

These and other objects and many of the attendant advantages of this invention will be readily appreciated from the following detailed description when considered in connection with the accompanying drawings.

DESCRIPTION OF THE PREFERRED EMBODIMENTS

Hereinafter, preferred embodiments of the present invention will be described in detail with reference to the accompanying drawings.

Figure 1A:
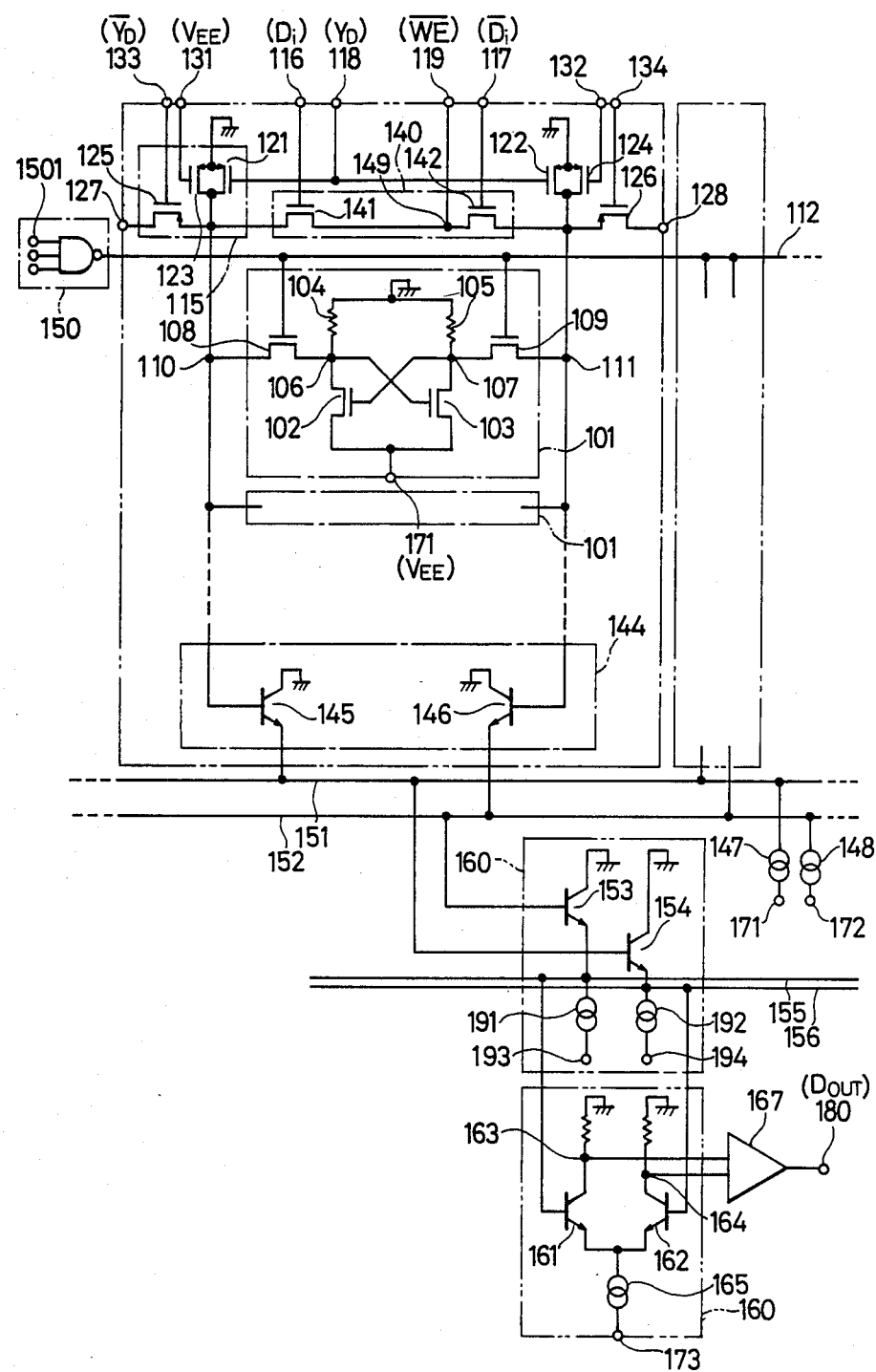
FIGS. 1A, 1B and 2 show a first embodiment of the present invention.

FIG. 1A is a structural view of a semiconductor memory circuit in accordance with one embodiment of the present invention. In the drawing, a memory cell 101 encompassed by two-dot chain line is composed of a flip-flop type memory data storage portion which consists of two N-MOSs (hereinafter called "NMOSs") 102 and 103 and two resistors 104 and 105, and two memory data transfer NMOSs 108 and 109 that are connected between the nodes 106 and 107 of the memory cell 101 and data lines 110 and 111, respectively. The gates of NMOSs 108 and 109 are connected to a word line 112, and m memory cells 101 are disposed on the data line pair to form a memory cell column while n memory cells 101 are disposed in the transverse direction, thereby forming m-row n-column memory cell array. A data line load MOSFET (MOS field effect transistor) 115 is connected to the data line pair 110, 111 in order to set the voltage of the data line pair. This circuit consists of PMOSs 121, 123 and 125 and the sources of PMOSs 121 and 123 are grounded. The gate of PMOS 121 is connected to a signal source which is turned ON in the read cycle of memory data and OFF in the write cycle of memory data. The gate 131 of PMOS 123 is connected to a negative power source $V_{EE}$. These gates are normally ON. When the data line load is constituted by two PMOS in this manner, the voltage of the data line 110, 111 can be easily reduced by NMOSs 141, 142 of the write circuit 140 in the write cycle of memory data and the following advantages can be obtained. Namely, MOS of NMOSs 141, 142 can be made small, power dissipation can be reduced because no current flows through the load PMOS 121 in the write cycle, and since the voltage of the data line to which the data is not written is made to be the ground voltage by PMOS 123 or 124, write error does not occur. Though the sources of PMOSs 123 and 124 are shown grounded in FIG. 1A, power dissipation can be reduced if they are connected to a node 127.

Load MOSs 125, 126 are disposed in order to provide a lower voltage than the ground voltage to all the data lines from which the memory data is not read out, and are turned OFF when they are connected to the data line to and from which data are written or read.

First of all, the data read-out operation of the memory circuit shown in FIG. 1A will be described in detail. When a decoder 150 receives an input address signal 1501 to read out the data of the memory cell 101, it raises the voltage of the word line 112 from $V_{EE}$ to 0 V. When the word line 112 reaches 0 V, NMOS 108 which is connected to the node having a lower voltage among the nodes of the memory cell 101 (the node 106 is hereby assumed to have the lower voltage) is turned ON, a current flows to the $V_{EE}$ node 171 through the data line load MOSFET 115 and NMOSs 108, 102 and the voltage of the data line 110 becomes the voltage which is the balance obtained by reducing the voltage drop by the data line load MOSFET 115 from 0 V. On the other hand, the voltage of the node 107 of the memory cell is 0 V and the voltage of the data line 111 is close to 0 V. Therefore, NMOS 109 remains OFF even when the voltage of the word line 112 is raised to 0 V, so that the current does not flow and the voltage drop of the data line 111 due to the data line load MOSFET 115 does not occur.

The voltages of the data line pair 110, 111 are connected to the bases of bipolar transistors 145 and 146, respectively. The emitters of these transistors 145, 146 are connected to common data lines 151 and 152. The emitters of bipolar transistors that are connected to the unselected data line pair arranged transversely are also connected to these common data lines 151, 152 and to a pair of constant current sources 147, 148. Here, selection and non-selection of the data line pair are made by switching load MOSs 121, 122, 125, 126. The voltage of the selected data line is about 0 V, while non-selection of the data line is made by supplying a negative voltage lower than 0 V, such as about −0.3 V, to the source nodes 127, 128 of the load MOSs 125, 126. According to this circuit arrangement, the current concentrates upon only the bipolar transistors (145 and 146 in this case) which are selected and attain the high voltage, and the voltages of the common data lines 151, 152 of their emitters are the balances obtained by reducing the base-emitter voltage $V_{BE}$ from the voltages of the data lines 110, 111, respectively, so that the voltage difference of the data line pair 110, 111 is transferred to the common data lines 151, 152. These common data lines 151, 152 are further connected to the bases of the bipolar transistors 153, 154 and their emitters are connected to the second common data lines 155, 156. After the voltage difference is transferred, it is introduced into a bipolar differential amplifier 160 and is picked up from an output node 180 through a sense amplifier output buffer circuit 167.

Next, the write operation of the memory data will be described in detail.

The data can be written into the memory cell 101 in the following way. (It will be assumed hereby that the node 106 is at the lower voltage and the node 107 is at the higher voltage.) First, the voltage of the word line 112 is raised to 0 V by the decoder 150 and the load MOSs 121, 122 are turned OFF by a $\overline{WE}$ signal representing the write state and a column select signal $Y_D$ to provide a negative voltage to the sources 149 of the write NMOSs 141, 142. The write signal $D_i$ and a signal $\overline{D_i}$ having the opposite phase to that of the former are applied to the gates 116, 117 of the NMOSs 141, 142, whereby the voltage of the data line 110 reaches $V_{EE}$ while the voltage of the data line 111 reaches 0 V. Under this state, the transfer MOS 108 is ON and the voltage of the node 106 is at the negative voltage $V_{EE}$. On the other hand, the voltage of the node 107 is raised by MOS 109 but its value corresponds to the lower one of the voltage as the balance obtained by reducing the threshold voltage of MOS 109 from the word line voltage, and the voltage of the data line 111. In other words, if the voltage of the word line 112 is set to be higher by at least the threshold voltage $V_{TH}$ than the voltage of the data line 111, the voltage of the node 107 can be made 0 V.

As described above, in FIG. 1A, write of data can be made easy by turning OFF MOS of the data line load MOSFET 115, and the node voltage on the higher voltage side of the memory cell 101 can be raised to a sufficiently high voltage and the node voltage on the lower voltage side, to the negative voltage $V_{EE}$ by raising the voltage of the word line to that of the data line. Accordingly, the voltage drop between the nodes of the memory cell 101 in the write cycle can be prevented. In FIG. 1A, furthermore, the voltage drop between the nodes of the memory cell 101 does not occur in the read cycle. Therefore, the data read operation of the memory cell 101 gets more stabilized than the conventional circuits to the extent corresponding to the absence of the voltage drop between the nodes of the memory cell. The increase of the voltage difference is about 2 V and reduction of the soft error rate can be improved by about thrice.

In FIG. 1A, the voltage of the selected data line pair is set to be higher than the voltages of the other data line pairs so as to transfer the former to the emitters by the emitter follower circuit of the bipolar transistors 145 and 146 and this data is led to the common data lines 151, 152 to which a plurality of emitters are connected in parallel, in order to take out the data from the selected data line pair 110, 111 to the common data lines 151, 152. When the common data lines to which a plurality of emitters are connected in parallel are disposed in two stages, it becomes possible to reduce the electrostatic capacity (parasitic capacity) of the common data lines 151, 152 and 155, 156 and to improve the response time of the common data lines.

Figure 2:
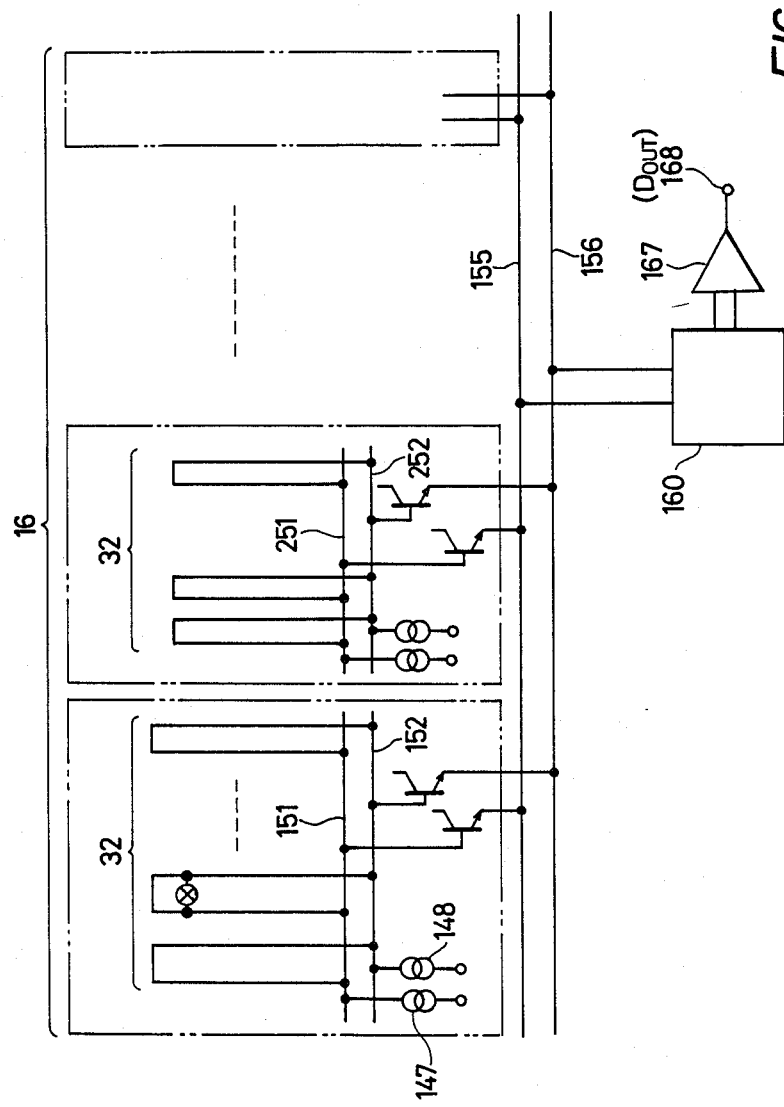

FIG. 2 shows the connection state of the common data lines in the two stages in the present invention. A 256 K-bit memory, for example, includes 512 pairs of data line pairs. If they are altogether connected to the common data lines 151, 152, the total capacity is 20 pF and the propagation delay of the common data lines increases to about 1.5 nS. If the common data lines are divided into the two stages consisting of 32 pairs and 16 pairs as shown in FIG. 2, on the other hand, the propagation delay of the common data lines is only the delay of the emitter follower circuit of the bipolar transistors and their total delay time can be reduced to 0.7 nS. In FIG. 2, a first block consists of 32 memory cell lines that are connected to the common data lines 151, 152 and a second block consists likewise of 32 memory cell lines that are connected to the next common data lines 251, 252. In this manner, 16 blocks are disposed in parallel with one another. These 16 blocks are connected to the bipolar transistor pairs, respectively, and each emitter of these transistor pairs is connected to a pair of common data lines 155, 156. One differential amplifier 160 is connected to these common data lines 155, 156. The output from the differential amplifier 160 reaches the output node 180 through the sense amplifier and the output buffer circuit 167.

If the number of common data line pairs is increased as described above, the current of the constant current sources 147, 148 increases in proportion to the increase of the number of common data lines, but the increase of power dissipation can be reduced y not connecting the constant current sources to those common data line pairs 151, 152 and 251, 252 to which the data is not transferred, and supplying a voltage which is lower by at least 0.3 V than the voltage of those common data lines which transfer the signal, to the common data lines not transferring the signal.

Figure 1B:
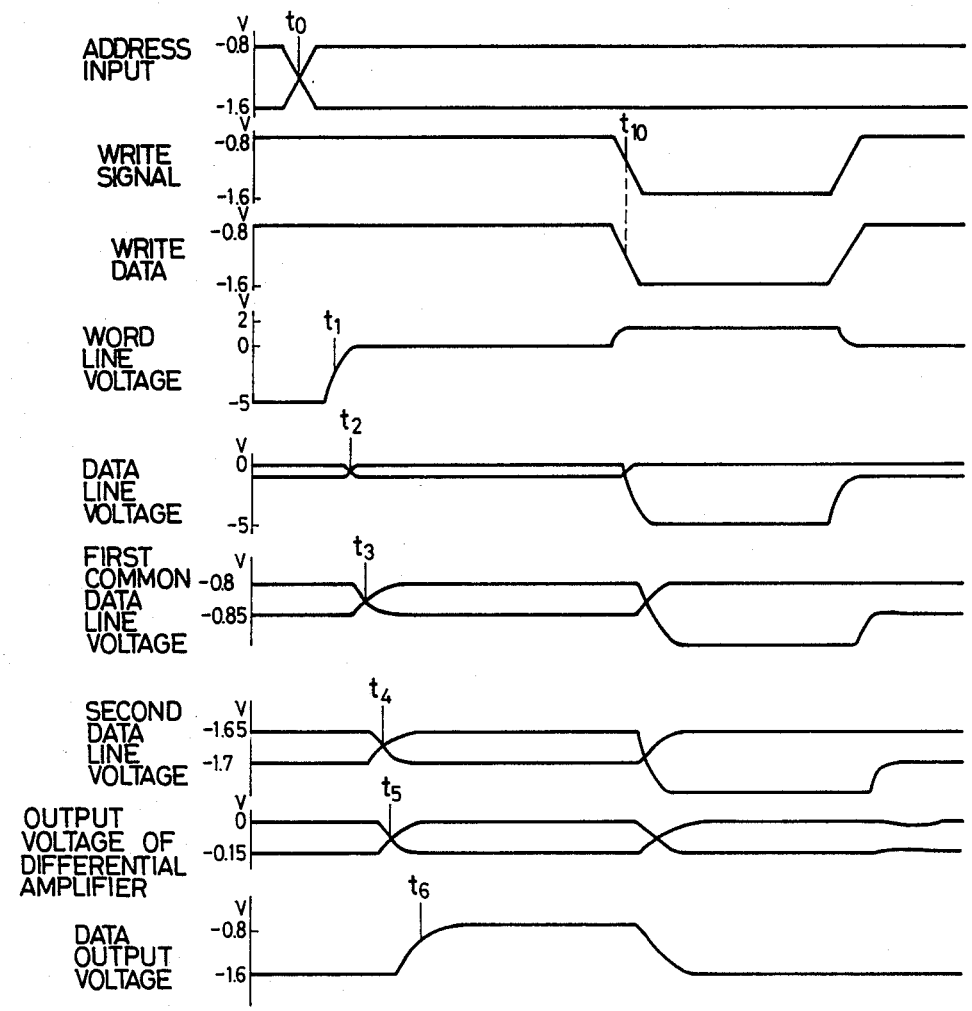

FIG. 1B is a time chart showing the voltage change in the data read-out and write-in operations of the memory circuit shown in FIG. 1A. First of all, the read operation of the memory data will be described in detail.

Assuming that the address input 1501 is switched at a time $t_o$, the voltage of the selected word line 112 rises at a time $t_1$ which is by about 4 nS after $t_o$, by the address buffer circuit and the decoder 150. When the voltage of the word line 112 rises, NMOS connected to the node having a lower voltage inside the memory cell 101, such as NMOS 108, becomes ON to lower the voltage of the data line 110 so that the voltage of the data line 111, that has been low before the read operation, is raised by the data line load MOSFET 115. If the time required before both of the voltages of these data lines become equal to each other is hereby called the "response time of the data lines", it is about 0.5 nS and is represented by time $t_2$ in the time chart. This voltage of the data line pair is transferred after about 0.3 nS to the first common data line pairs 151, 152 at a time $t_3$, after about 0.3 nS to the second common data lines 155, 156 at a time $t_4$ and after about 0.5 nS to the terminals 163, 164 of the differential amplifier 160 at a time $t_5$. Furthermore, a signal is outputted at a time $t_6$ from the output terminal 180 through the output circuit 167. The approximate voltage value at each terminal is shown in FIG. 1B.

Next, the write operation will be described in detail. In FIG. 1B, when the signal $\overline{WE}$ instructing the write operation falls at a time $t_{10}$ and the voltage of the write data $D_i$ drops, NMOS 142 of the write circuit 140 is ON and since the terminal 149 is at the low voltage $V_{EE}$, the data line 111 drops to the low voltage $V_{EE}$ and the voltage of the terminal 107 drops through NMOS 109. One 110 of the data lines is 0 V and the voltage of the node 106 of the memory cell 101 are raised by NMOS 108 and the voltage of the node 107 drops from the word line voltage to the lower one of the threshold voltage of NMOS 108 and the voltage of the data line 110. Here, the voltage of the node 107 is 0 V. A clamp circuit is disposed in order to prevent a drastic drop of the voltage of the common data line 152 due to the voltage drop of the data line 111 at this time so that voltage drop is not greater than a constant value, i.e. $-0.5$ V. Preferably, the output buffer circuit 167 is constituted in such a fashion that even when an erroneous data is outputted, a signal having a low voltage which does not exert adverse influences to the outside is outputted from the output terminal 180.

Figure 3:
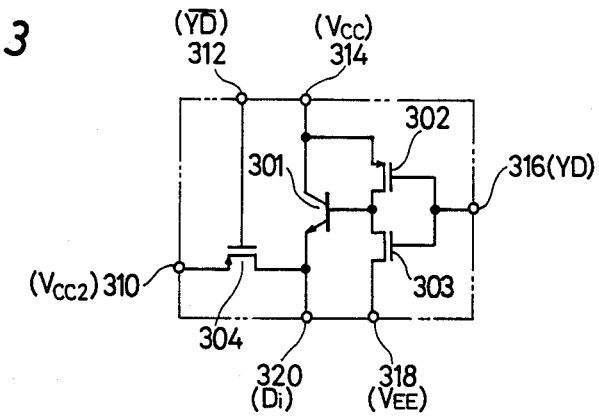
FIGS. 3 to 10 show a load circuit, a write circuit and a word line driver constituting the present invention and are diagrams useful for explaining these circuit devices.

FIG. 3 is a structural view of the data line load circuit 115 in accordance with another embodiment of the present invention. In this load circuit, a bipolar transistor 301, PMOS 302 and NMOS 303 are disposed in place of PMOS 121 in the load circuit shown in FIG. 1, a column select signal $Y_D$ is connected to a node 316 while a column select inversion signal $\overline{Y_D}$ is connected to a node 312. Furthermore, a positive voltage $V_{cc}$, a negative voltage $V_{EE}$ and a voltage $V_{cc2}$ which is about ($V_{cc} - 1.1$ V) are connected to nodes 314, 318 and 310, respectively, while the data line is connected to a node 320.

In this circuit, when the column select signal is at the low voltage and PMOS 302 is turned ON with NMOS 303 and PMOS 304 being turned OFF, the voltage of the node 320 is given by V320 satisfying the following equation with I representing a current flowing through the node 320:

$$I = I_o \exp\left[\frac{q(V_{cc} - V_{320})}{kT}\right]$$

where
 $I_o$: constant,
 q: charge of electron,
 k: Boltzman's constant,
 T: temperature.

The current flowing through the data line is given by the sum of the current to the selected memory cell and the base current of the bipolar transistor 145 (shown in FIG. 1A) connected to the data line. Here, the current to the memory cell is about 50 $\mu$A while the base current is about 10 $\mu$A, so that the current of 60 $\mu$A and the current of 10 $\mu$A flow through the data line pair, respectively. As a result, the difference $\Delta V$ between the node voltages of both load circuits is about 45 mV from the equation given above.

As is obvious from the relational formula given above, the voltage difference of the data line pair is determined by the ratio of the currents flowing through the load circuits and its change remains to be about 18 mV even when the current ratio changes by twice, so that this load circuit can generate a stable voltage difference of the data line pair even when the data line amplitude is made small.

Besides the reduction of the voltage difference of the data line pair, the use of this load circuit can raise the data line voltage, that is low immediately after the data write operation, to a high voltage within a short period by the great driving capability of the bipolar transistor.

Figure 4:
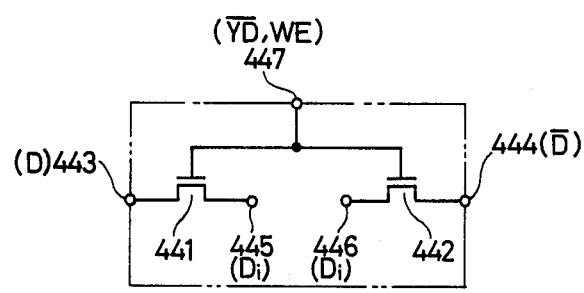

FIG. 4 is a structural view of a data write circuit 140 in accordance with still another embodiment of the present invention. Though NMOSs 141 and 142 are disposed in the data write circuit 140 in FIG. 1A, a product signal between the column select signal $Y_D$ and the write instruction signal WE is supplied to the gates 447 of NMOSs 441 and 442 of the data write circuit shown in FIG. 4 and the write data signal $D_i$ and its inversion signal $\bar{D}_i$ are supplied to the nodes 445 and 446, respectively. This data write circuit is simpler in construction than the circuit shown in FIG. 1A because it eliminates one invertor.

Figure 5:
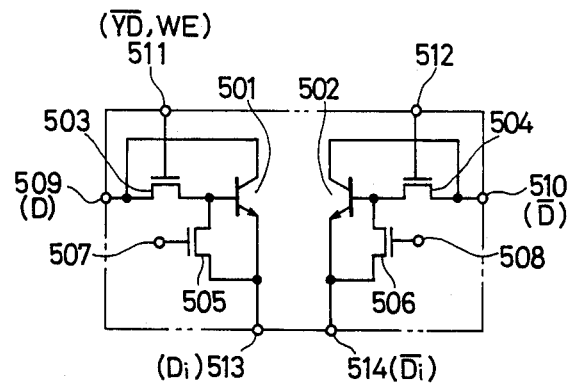

FIG. 5 is a structural view of the write circuit in accordance with still another embodiment of the present invention. In order to improve the driving capability of NMOSs 441 and 442 shown in FIG. 4, the circuit in FIG. 5 comprises a composite circuit consisting of bipolar transistors 501, 502 and NMOs 503, 504, 505, 506. The product between the column select signal $Y_D$ and the write display signal WE is inputted to the nodes 511, 512 and the nodes 509 and 510 are connected to the data line pair. Furthermore, the gates 507 and 508 of NMOSs 505 and 506 are connected to the high voltage $V_{cc}$ while the nodes 513 and 514 are connected to the write data line signal $D_i$ and its inversion signal $\bar{D}_i$, respectively. This circuit improves the driving capability and the write time can be reduced by about 30% when compared with the circuit shown in FIG. 4.

Figure 6:
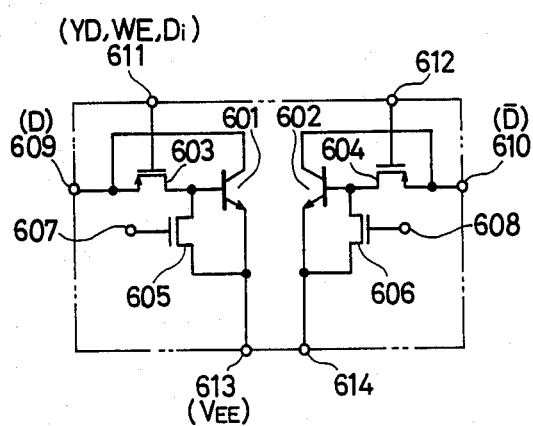

FIG. 6 is a structural view showing the data write circuit in accordance with still another embodiment of the present invention. Though the write data signals $D_i$ and $\bar{D}_i$ are connected to the nodes 513 and 514 in FIG. 5, the nodes 613 and 614 in FIG. 6 corresponding to the nodes 513 and 514 are connected to the negative voltage $V_{EE}$, and $Y_D$ WE $D_i$ and $Y_D$ WE $\bar{D}_i$ prepared from the column select $Y_D$, the write instruction signal WE and the write data signal $D_i$ are supplied to the gates of NMOSs 603 and 604, respectively. This circuit can reduce the load capacitance of the write data $D_i$, $\bar{D}_i$ lines without lowering the load driving capability of the data write circuit shown in FIG. 5 and the size and power dissipation of the $D_i$, $\bar{D}_i$ generation circuit can be reduced.

Figure 7:
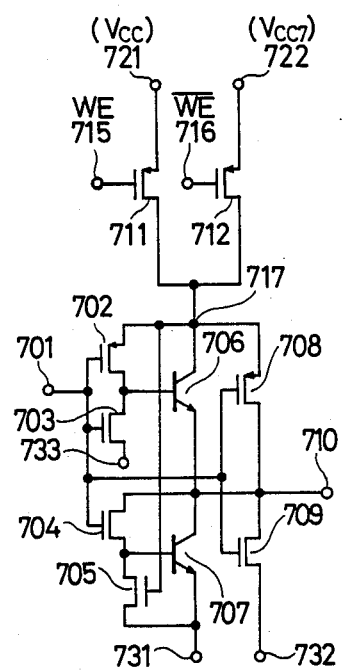

FIG. 7 is a structural view showing a word driver in accordance with still another embodiment of the present invention. When the write instruction signal WE is at the high voltage and the signal WE and its inversion signal $\overline{WE}$ are supplied to the gates 715 and 716 of PMOSs 711 and 712, respectively, the voltage of the node 717 is changed over from the voltage $V_{CC}$ supplied from the node 721 to the voltage $V_{CC7}$ supplied from the node 722.

First of all, when the word line select signal corresponding to the address signal reduces the voltage of the node to the low voltage, PMOSs 702 and 708 are turned ON, the bipolar transistor 706 is turned ON and the voltage of the word line driving node 710 reaches the voltage of the node 717. The voltage of the node 717 is changed over by the write instruction signal WE and since the voltage $V_{CC7}$ which is higher than $V_{CC}$ is supplied to PMOS 712 under the write state (when $\overline{WE}$ is at the low voltage), the word line is held at $V_{CC7}$. When the word line is under the non-selected state and the node 701 reaches the high voltage, PMOS 702 is turned OFF while NMOS 704 is turned ON so that the bipolar transistor 707 and NMOS 709 are turned ON and the voltage of the node 710 on the connection side of the word line drops to the low voltage $V_{EE}$.

Next, under the read state, the WE signal is at the low voltage so that $V_{CC}$ is supplied to the node 717 and the word line voltage is $V_{CC}$ under the selected state and $V_{EE}$ under the non-selected state. As described with reference to the operation of the circuit shown in FIG. 1A, the node voltage on the higher voltage side of the memory cell in this circuit is determined to be the lower one of the data line voltage $V_{CC}$ and the difference voltage of the word line voltage minus the threshold voltage $V_{TH}$ of MOSFET in the write cycle, so that the word liee voltage $V_{CC7}$ needs be higher by at least $V_{TH}$ than $V_{CC}$ in order to raise the node voltage to $V_{CC}$ by the data write operation. In this manner, the higher voltage node of the memory cell reaches $V_{CC}$ after the data write operation and the voltage difference between the nodes inside the memory cell is $V_{CC}$. For this reason, the memory data can be held more stably and immunity to noise such as $\alpha$ rays can be improved. Incidentally, the negative voltage $V_{EE}$ is supplied to the terminals 731, 732 and 733.

Figure 8:
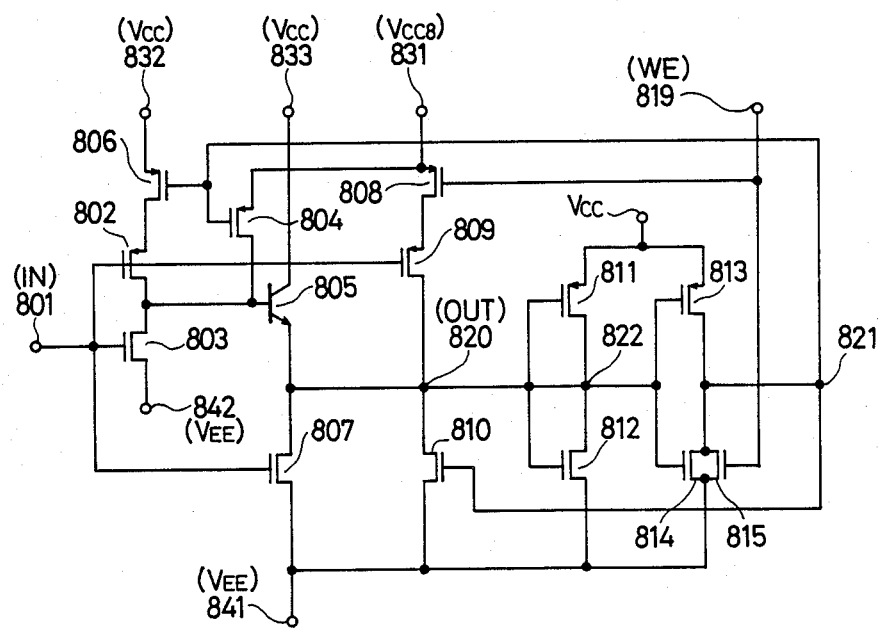

FIG. 8 is a structural view showing the word driver in accordance with another embodiment of the present invention. In this circuit, when the word line select signal is inputted to the terminal 801 and this signal drops from the non-selected high voltage $V_{CC}$ to the selected voltage $V_{EE}$, the output nodes 820 and 821 are at the low voltage $V_{EE}$ and consequently, PMOS 806 is turned ON. Further, the voltage of the node 801 drops and PMOS 802 is turned ON so that its current is supplied to the bipolar transistor 805 and the current flows from the collector to the emitter, thereby raising the voltage of the output node 820. When the voltage of the output node 820 rises, PMOS 811 is turned OFF while NMOS 812 is turned ON to reduce the voltage of the node 822 to drive the next inverter circuit. As a result, the voltage of the node 821 rises, but there is a time lag of about 2 nS before the rise of this voltage. Therefore, after 2 nS from the rise of the output node voltage, the voltage of the node 821 rises and the bipolar transistor 805 is turned OFF so that the bipolar transistor 805 is turned OFF and the voltage drops towards the voltage $V_{CC8}$ connected to the node 831 through PMOSs 808 and 809 that are turned ON, and is kept at that voltage. Next, the word line shifts to the non-selected state, the voltage of the node 801 changes from the low voltage to the high voltage. As a result, PMOs 802 and 809 are turned OFF while NMOS 807 is turned ON, so that the output node 820 drops to $V_{EE}$ and is kept at that voltage.

On the other hand, under the write state or when the write instruction signal WE having the high voltage is supplied to the node 819 and the word line is under the selected state, PMOS 808 is turned OFF while NMOS 815 is turned ON, the voltage of the node 821 drops to the low level $V_{EE}$ and PMOS 806 is turned ON so that the voltage of the node 820 turns ON the bipolar transistor by the current through PMOSs 806 and 802 and raises the voltage to $V_{CC}$. When the voltage of the output node 820 is raised to the high voltage $V_{CC}$, this state is held and the word line is kept at a value close to the high voltage $V_{CC}$.

In this circuit, the word line is kept at the high voltage under the data write state in the same way as in the circuit shown in FIG. 7. Therefore, this circuit provides the effect of stabilizing the memory data storage as in FIG. 1A and under the read state, the voltage is set to the high voltage only for the first 2 nS period when the word line voltage reads out the new data in order to let the data line respond at a high speed. After the response of the data line, the word line is set to the low voltage so that the voltage difference between the data line pair, that is, the swing of the memory signal of the data line, is reduced and the response of the next data line can be made at a high speed. Furthermore, in this circuit, the voltage is at the high voltage only for the 2 nS period in which the word line shifts from the low voltage to the high voltage, and thereafter or when the selected word line does not change, the voltage is kept at the voltage $V_{CC8}$ which is a little bit lower than $V_{CC}$. Therefore, the gate voltage of the data transfer MOSs (e.g. MOSs 108 and 109 in FIG. 1) inside the memory cell drops and the current to the memory cell decreases. As a result, power dissipation can be reduced.

Figure 9:
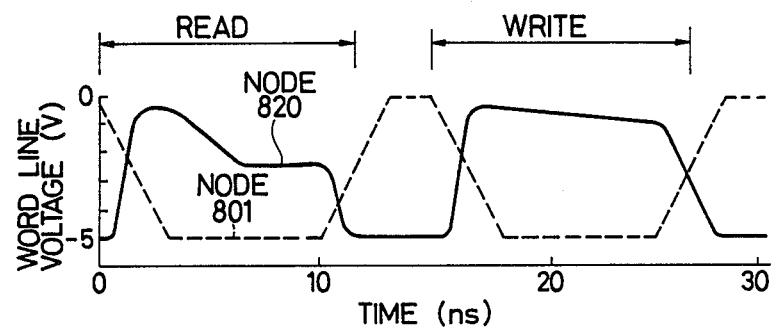

FIG. 9 shows the time change of the input node for the purpose of explaining the operation of the circuit shown in FIG. 8. In the diagram, the voltage changes of the input node 801 and output node are shown separately for the data write operation and the data read operation. The voltage of the input node 801 drops from 0 V to −5 V in the period from 0 nS to 3 nS. At this time, the output node 820 starts rising from 0.5 nS and after attaining −0.5 V, it is held at that voltage for about 2.5 nS, then drops to $V_{CC8}$ till 6 nS and is held at that voltage. This corresponds to the data read state, that is, the state where the data write instruction signal WE is at the low voltage. Next, 15 nS and so forth in FIG. 9 shows the data write state, that is, the state where the write instruction signal WE is at the high level, the input node 801 is selected and its voltage drops from the high voltage to the low voltage. It can be understood that the voltage of the output node 820 rises to $V_{CC}$, drops slightly thereafter with the passage of time and is held substantially at the high voltage.

Figure 10:
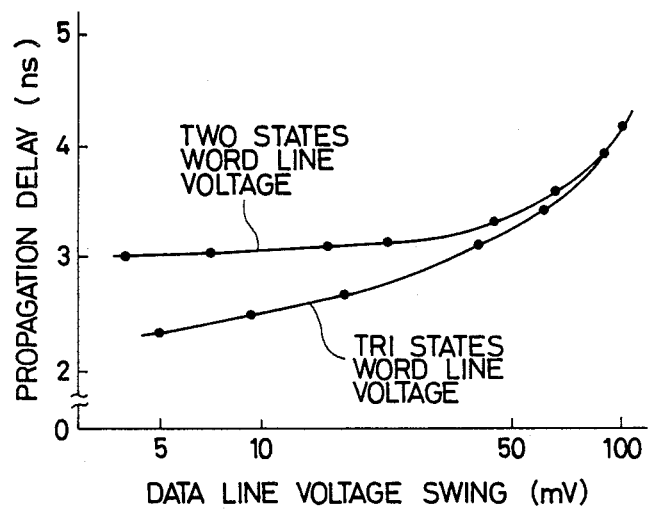

FIG. 10 is a diagram showing the effect of improvement in the data read speed when the word driver shown in FIG. 8 is used, in connection with the voltage difference between the data line pair, that is, the data line swing. Here, the term "propagation delay" means the time from the arrival of the word line voltage to $(\frac{1}{2})V_{EE}$ to the output of the ECL output signal. The data line swing is caused by changing the magnitude of the load MOS (e.g. MOS 121 in FIG. 1A) with the memory cell being the same. As is obvious from FIG. 10, a high operation speed can be obtained when the data line swing is up to 60 mV when the word line voltage is tri-state than when it is two-state as in the conventional circuits.

Figure 11:
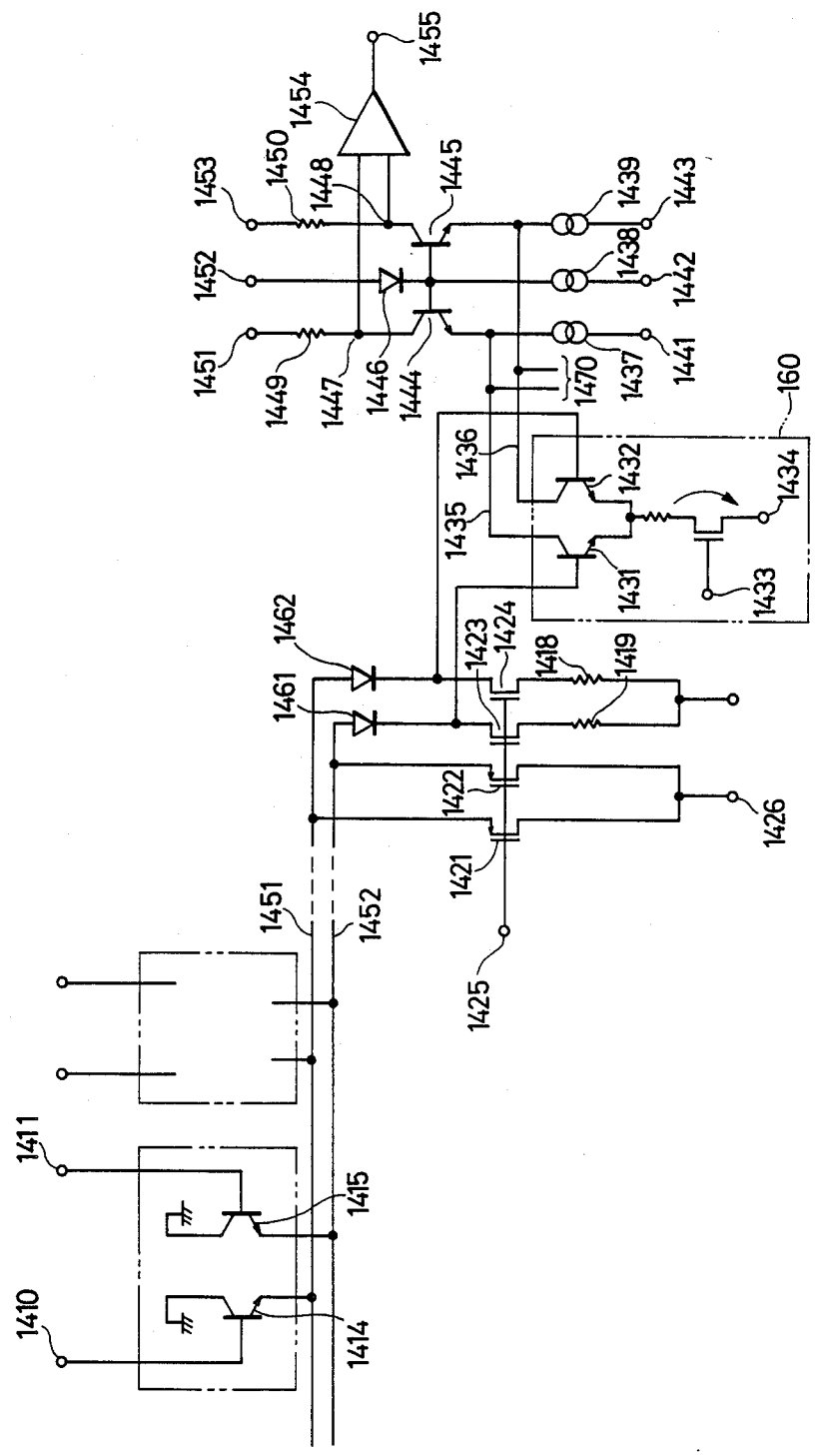
FIGS. 11, 12 and 14 show sense amplifiers and other post-stage circuits constituting the present invention.

FIG. 11 is a structural view showing the sense amplifier and the subsequent multiplexer and output buffer circuit. The same sense amplifier as the sense amplifier 144 shown in FIG. 1A is used and its emitter is connected to the common data line 1451, 1452. Though the constant current sources are connected to the common data lines in FIG. 1A, the circuit shown in FIG. 11 uses NMOSs 1423, 1424 and resistors 1418, 1419 connected to the negative voltage $V_{EE}$ as the constant current source. There are also disposed a power source node 1426 for supplying a predetermined voltage to the common data lines 1451, 1452 under the state where the signal is not taken out from the common data lines 1451 and 1452, and PMOSs 1421 and 1422 for switching the node 1426.

Here, the data line signal can be read out from the terminals 1410 and 1411 in the following way. First, NMOSs 1423 and 1424 as the constant current source are turned ON so as to turn ON diodes 1461 and 1462 and to transfer the voltage of the anodes of the diodes to the cathodes. The cathode voltages are then led to the bases of bipolar transistors 1431, 1432 as the differential amplifier and NMOS 1433 as its constant current source is turned ON by raising its gate voltage, whereby its signal is transferred to the emitters of the bipolar transistors 1444, 1445 and is detected as the voltage drop through resistors 1449, 1450. The signal is outputted to the output node 1455 by the next sense amplifier 1454.

On the other hand, when the signals of the common data lines 1451 and 1452 are not taken out, NMOSs 1423, 1424, 1433 are turned OFF so that the signals of the common data lines are not transferred to the second common data lines 1435, 1436, while PMOSs 1421, 1422 are turned ON so as to keep the common data lines 1451, 1452 at a predetermined voltage. Since the voltage can be held at the predetermined voltage supplied from the terminal 1426, the next data read processing at a high speed can be prepared. Under the state where the data of the common data lines 1451, 1452 are not read out, the signal from the circuit analogues to the circuit 160 connected to the second common data lines 1435, 1436 is supplied to the node 1470, led to the emitters of the bipolar transistors 1444, 1445 and outputted to the sense amplifier 1454. In other words, during the read operation of the memory data, only one constant current source analogous to the one that consists of PMOSs 1421, 1422 and only one constant current source analogous to the one that consists of NMOS 1433 and a resistor 1434 operate so that a signal detection circuit having a high operating speed and low power dissipation can be obtained.

Figure 12:
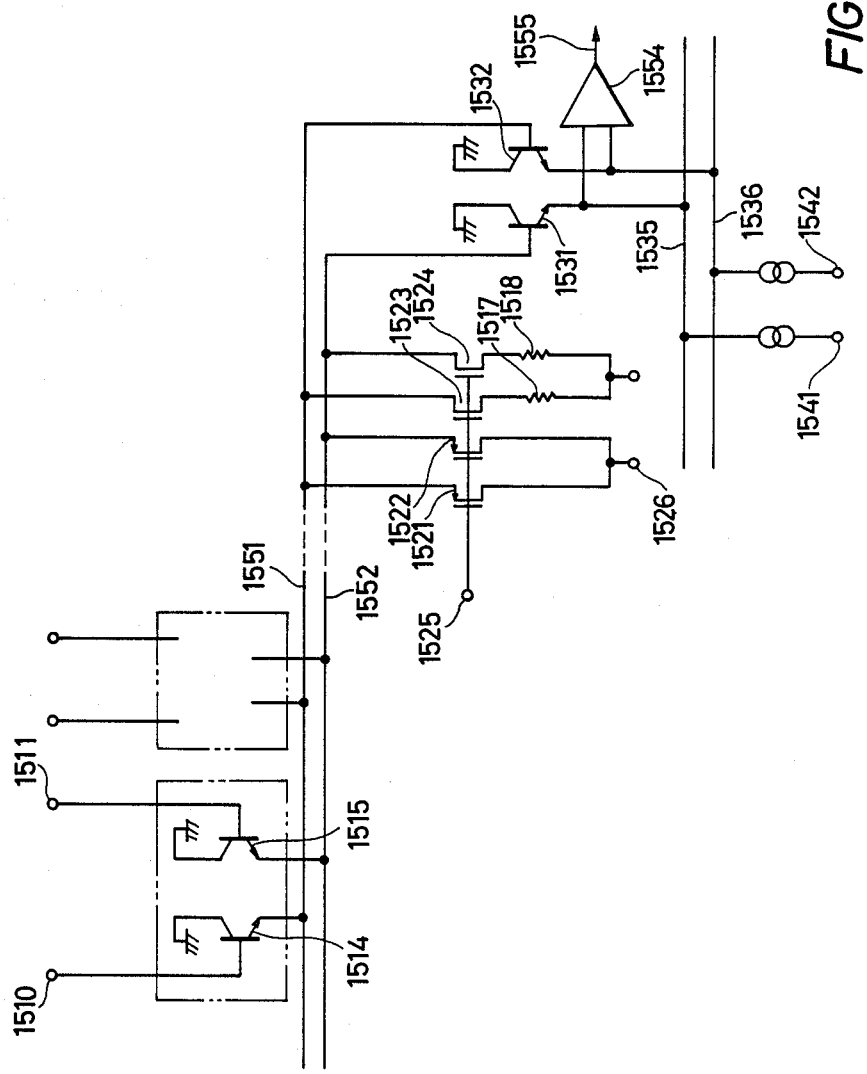

FIG. 12 is a structural view showing the sense amplifier and the subsequent signal processing circuit in accordance with still another embodiment of the present invention. Though the constant current sources are normally connected to the common data lines in FIG. 1A, the constant current source in the circuit shown in FIG. 12 consists of NMOSs 1523, 1524 and resistors 1517, 1518 and this constant current source is cut off by NMOSs 1523, 1524 to reduce power dissipation when the data are not read out from the common data lines 1510, 1511, that is, when all the supply voltages from the load circuit 115 (see FIG. 1A) to the data lines connected to the common data lines 1551, 1552 become low and the common data line voltages are low. Incidentally, when NMOSs 1523, 1524 are turned OFF, it becomes difficult to determine the voltage of the common data lines 1551, 1552. Therefore, there is disposed a circuit which supplies a power source voltage of a predetermined voltage connected to the node 1526 by PMOSs 1521, 1522 to keep the common data lines 1551, 1552 at a constant voltage. According to this arrangement, the constant current source of the common data line 1551, 1552 causes a current to flow only through the common data line from which the data is read out. Therefore, when 32 pairs of common data lines 1551, 1552 exist, for example, power dissipation can be reduced to 1/32 of that of the circuit shown in FIG. 1A not having this circuit.

Figure 13:
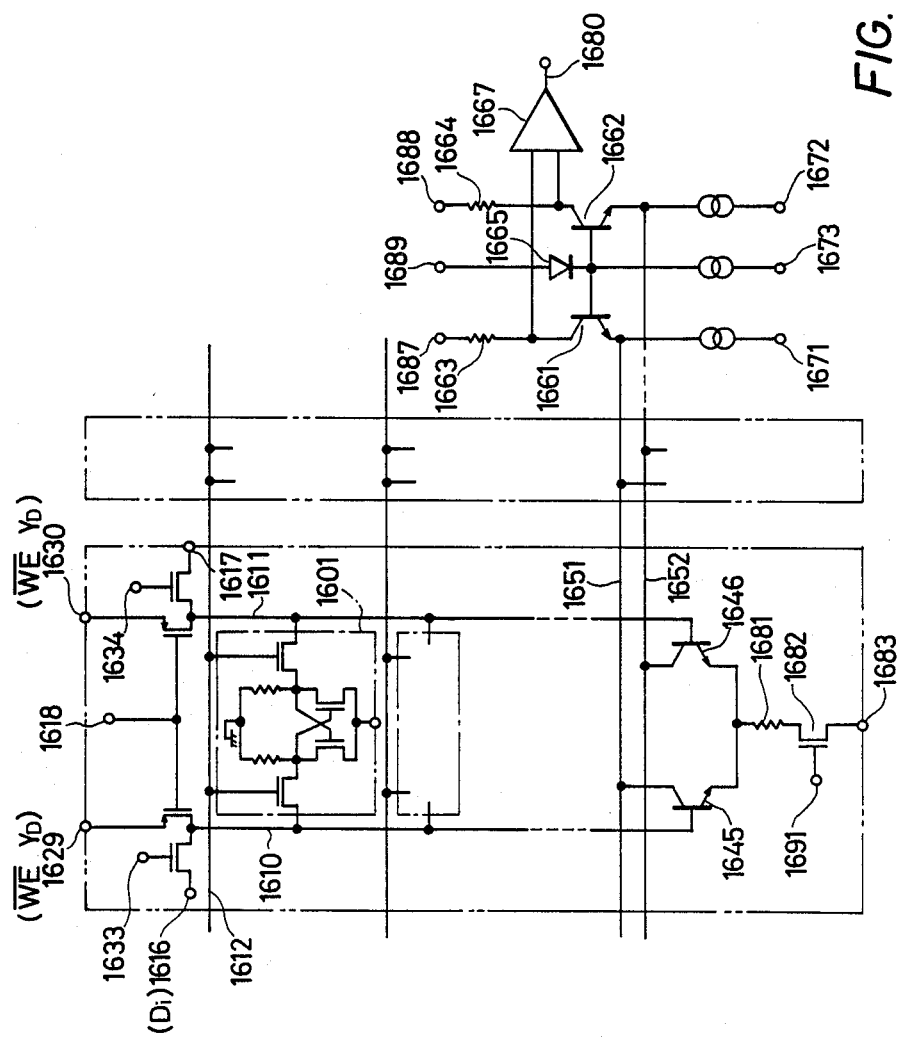
FIGS. 13 and 15 show a memory circuit constituting the present invention.

FIG. 13 is a structural view of the memory circuit in accordance with still another embodiment of the present invention. The memory cell 1601 and the data line load circuit have the same construction as those of FIG. 1A. The data line signal detection circuit is analogous to the memory circuit disclosed in Japanese Patent Laid-Open No. 12994/1980 described already. In the circuit shown in FIG. 13, however, a positive voltage $V_{CC16}$ is applied to nodes 1687, 1688, 1689 of resistors 1663, 1664 and diode 1665, and this positive voltage $V_{CC16}$ is set to the higher than the positive voltage $V_{CC}$ used in the circuit of the above-mentioned prior art reference. According to this circuit arrangement, the level-shifting bipolar transistors between the data lines and the input of the differential amplifiers become unnecessary so that the chip area can be reduced and the operation speed of the chip can be improved.

Incidentally, the resistor 1681 and NMOS 1682 together constitute the current source n FIG. 13, but it is possible to constitute the current source by NMOS 1682 alone by eliminating the resistor 1681 or to inverse the connection between the resistor and NMOS. It is preferred that the voltage generated inside LSI be applied to the nodes 1683, 1691 and the voltage of the node 1683 be set so that the difference between the voltage generated inside LSI and the gate voltage for turning ON NMOS 1682 is hardly affected by the change of the power source voltage in order to supply more stable current.

Since the description given above deals with the case where the ground voltage is supplied to the nodes 1629, 1630 in the same way as in FIG. 1A, a voltage higher than the ground voltage is supplied to the nodes 1687, 1689. However, it is possible to set the supply voltage to the nodes 1687, 1688, 1689 to a level close or equal to the ground voltage by setting the supply voltage to the nodes 1629, 1630 to a level lower than the ground voltage. It is further possible to dispose a level shift diode between the data line 1610, 1611 and the base of the transistor 1645, 1646 as disclosed in the aforementioned prior art reference so as to bring the supply voltage to the nodes 1687, 1688, 1689 close as much to the ground voltage, or to use a diode and a resistor having a small voltage drop as the diode 1605 so as to reduce the voltage drop and to reduce the supply voltage to the nodes 1687, 1688, 1689 as much. The supply voltage to the nodes 1687, 1688, 1689 can be made equal to the ground voltage by combining these methods described above.

It is further possible to use two transistors connected in parallel in the same way as in FIG. 1A as the PMOS connecting the nodes 1629, 1630 to the data lines 1610, 1611.

Figure 14:
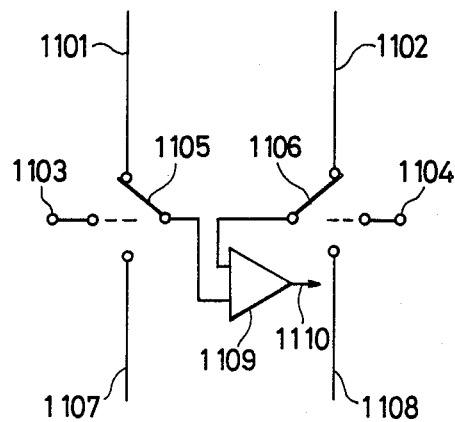

FIG. 14 is a structural view of the sense amplifier in accordance with still another embodiment of the present invention. Unlike FIG. 1A which uses a pair of sense amplifiers 144 for each data line pair, the embodiment shown in FIG. 14 does not use such a sense amplifier pair but disposes a sense amplifier 1109 having a pair of inputs between upper and lower two pairs of data lines 1101, 1102 and 1107, 1108, and switches are added to these sense amplifier inputs 1105, 1106 to change over the connection of the input terminals of the sense amplifier to the data line pair which detect the data in order to detect the signal. According to this arrangement, the number of the data line pairs becomes ½ and the chip area can be reduced. Therefore, when the same number of sense amplifiers as in the pair art apparatuses are disposed, the number of memory cells connected to the data line pairs becomes ½, their length becomes ½, too, and the electrostatic (parasitic) capacity of the data lines becomes ½ with the result of the improvement of the response of the data lines.

In FIG. 14, switch nodes 1103, 1104 are disposed in order to transfer the write signal to the data line pairs 1101, 1102, 1107, 1108 and the write data signals $D_i$, $\overline{D_i}$ are connected to these nodes. When the data write signal WE is under the write state, these nodes are connected to the data line pair 1101, 1102 or 1107, 1108 so that the write operation can be sped up in the same way as the read operation. Incidentally, the power source $V_{EE}$ is connected to the nodes 1103, 1104, and it is possible to use the product signal of the write signal and the data signal $D_i$ as the switch signal.

Figure 15:
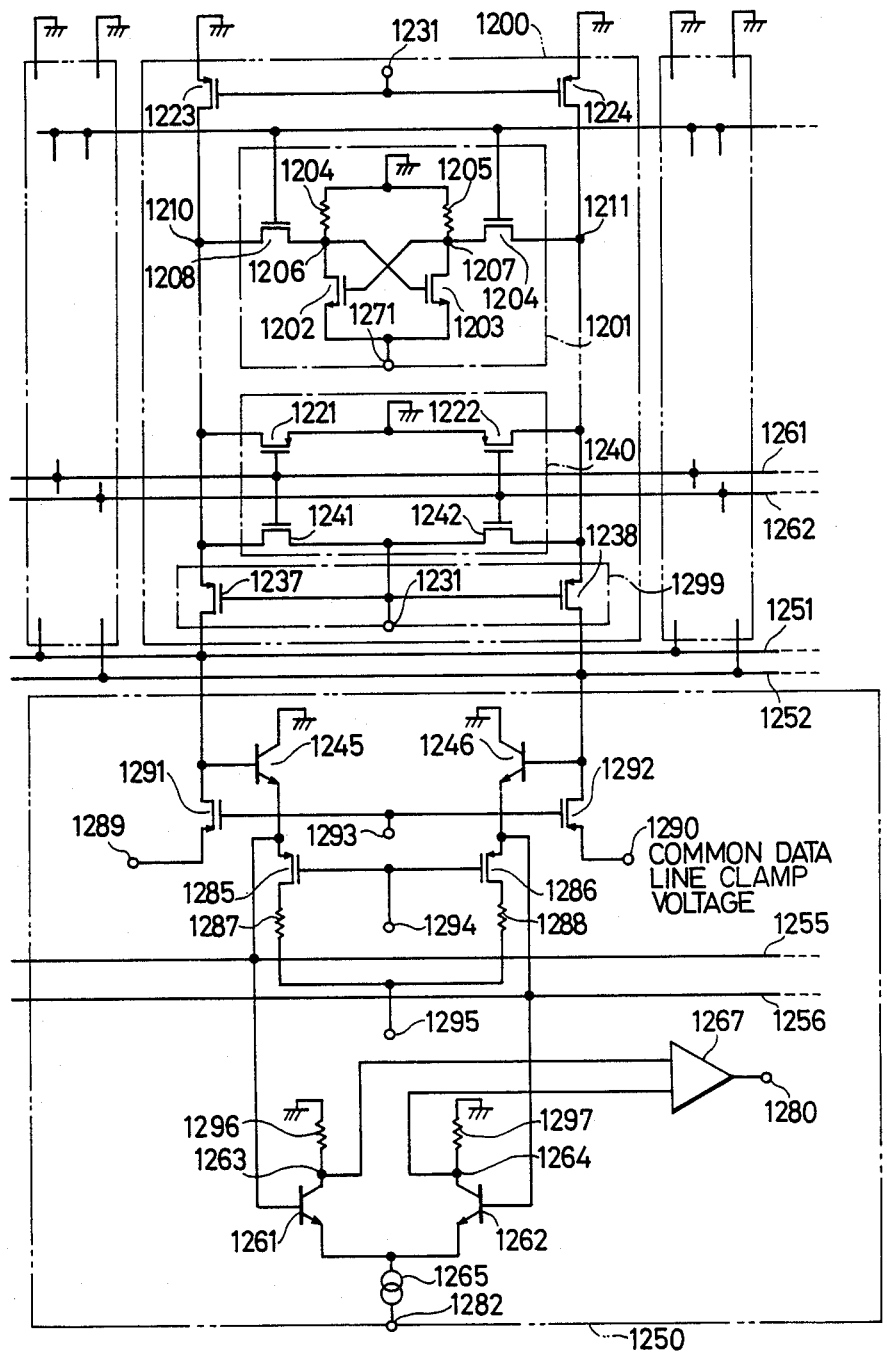

FIG. 15 is a structural view showing the memory circuit in accordance with still another embodiment of the present invention. In FIG. 1A, selection and non-selection of the data lines are made by changing the voltages to be supplied from the data line load circuit 115 to the data lines. According to this circuit arrangement, the bipolar transistor pair 145, 146 constituting the sense amplifier for transferring the data line voltage to the common data line is necessary for each data line pair. In contrast, in the circuit shown in FIG. 15, the voltages to be supplied from PMOSs 1223, 1224, 1221, 1222 to the data lines 1210, 1211 are the highest voltage (here, the ground voltage) in this circuit, and the signal read operation of the data lines is made by ON/OFF of PMOSs 1237 and 1238 that constitute the Y switch. In other words, the Y switch of the data lines for reading the memory data is turned ON, led to the common data lines 1251, 1252 and detected by the bipolar transistors 1245, 1246. Accordingly, the memory data can be read out by disposing only one pair of bipolar transistors in the common data lines 1251, 1252. When the memory data to the common data lines 1251, 1252 is not read out, the voltage of the common data lines is supplied to the nodes 1289, 1290 through PMOSs 1291, 1292 and when the voltage is set to a level lower by about 0.3 V than the data line voltage 1210, 1211, it becomes possible to collect the memory data and to lead it to the differential amplifier by use of the second common data lines 1255, 1256 shown in FIG. 1A.

The data write operation of this memory circuit is made by supplying the product WE.D$_i$ between the write instruction signal WE and the write data signal D$_i$ and the product WE.D$_i$ between WE and the inversion signal D$_i$ of D$_i$ to the nodes 1261, 1262, supplying the data line select signal Y$_D$ connected to the node 1231 to NOMSs 1241, 1242, turning ON NMOS 1241 or 1242 which is higher by the higher one of WE.D$_i$ and WE.D$_i$ and thus reducing the data line voltage. Though the description given above deals with the data line load circuit, the write circuit and the differential amplifier in their simplest form, various circuits that can be applied to FIG. 1A can also be employed.

Figure 16:
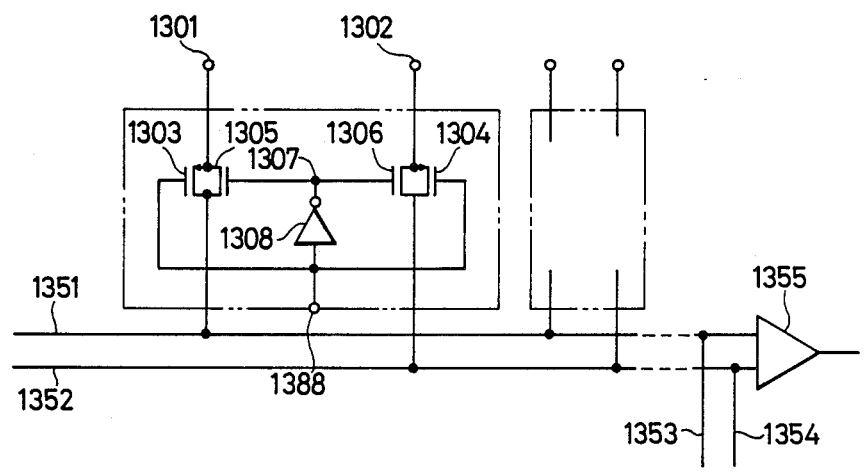
FIG. 16 shows another example of a data line switch circuit.

FIG. 16 is a structural view showing another example of the data line switch circuit (Y switch) shown in FIG. 15. As described above, the data line switch 1299 of FIG. 15 effects the switching operation by ON/OFF of PMOSs 1237, 1238. For this reason, when the voltages of the data lines and common data lines drop close to the low voltage V$_{EE}$, the conduction factor of PMOS becomes small and renders an obstacle when sending the write signal through this switch circuit. Therefore, the write circuit must be connected directly to the data lines. If this arrangement is used, the advantage that the high speed write operation can be made, can be obtained, but the number of write circuits and their occupying area increase and the circuit as a whole becomes more complicated in construction. In the switch circuit shown in FIG. 16, PMOSs 1303, 1304 are connected in parallel with NMOSs 1305, 1306 and signals having opposite phases are applied to their gates to make switching. In this manner, the change of the conduction factor of this switch becomes small irrespective of the voltages of the data line and common data lines, and the write signal can be sent through this switch circuit. Therefore, the data can be written into the memory cells by connecting the write circuit to the common data lines and turning ON this switch by the column select signal Y$_D$, and it becomes possible to simplify the write circuit, which has been complicated in construction conventionally, and to reduce its occupying area.

Figure 17:
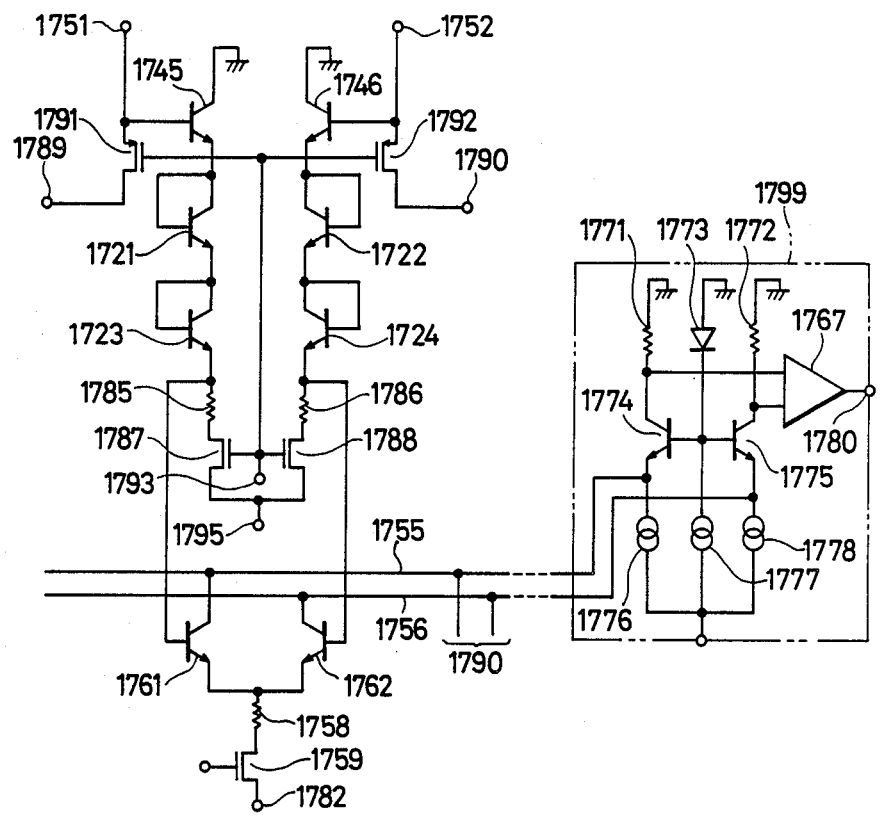
FIG. 17 shows another example of a data line signal sensing circuit.

FIG. 17 is a structural view showing a modified example of the data line signal detection circuit shown in FIG. 15. The data line signal detection circuit 1250 shown in FIG. 15 is formed by connecting the second common data lines 1255, 1256 in parallel with the emitters of the bipolar transistors 1245, 1246, respectively. According to this circuit arrangement, when the voltage difference between the common data line pair 1255, 1256, that is, the signal swing, becomes great, the propagation delay increases due to the parasitic capacitance and hence the signal swing must be limited to below 100 mV.

In the circuit shown in FIG. 17, the signal of the second common data lines 1755, 1756 is transmitted by the current so as to limit the signal swing of the second common data lines to below 30 mV and to reduce the influence of the parasitic capacitance. This circuit is analogous to the signal detection circuits after the second common data lines in the circuits shown in FIGS. 11 and 13, and the operating conditions of the latter can be applied to the former. However, another characterizing feature of the circuit of FIG. 17 lies in that the voltage at the common data line nodes 1751, 1752 is first level-shifted by about 2.5 V by bipolar transistors 1745, 1746 and diodes 1721, 1722, 1723, 1724 and is then led to the bases of the bipolar transistors 1761, 1762 so that the signal is detected as the voltage drop of the resistors 1771, 1772. If level-shift is made in this manner, the supply voltages to the resistors 1771, 1772 and the diode can be made to be the ground voltage, and there can be obtained the advantage that one power source of the positive voltage can be reduced when compared with the circuit shown in FIG. 13. Though the circuit shown in FIG. 1 requires the same number of bipolar transistors as that of the data lines, the number of bipolar transistor may be one for each common data line pair in the circuit shown in FIG. 17 and the freedom of design and layout can be therefore improved. The other circuit operations are similar to those of the foregoing circuits and are therefore omitted.

Figure 18:
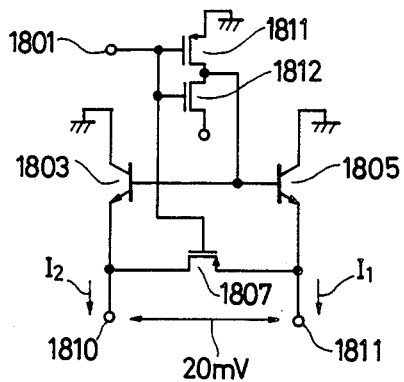
FIG. 18 shows another example of a data line load circuit.

FIG. 18 is a structural view showing a modified example of the data line load circuit shown in FIG. 15. The circuit which functions as PMOSs 1221, 1222 of the data line load circuit 1240 shown in FIG. 15 is shown in FIG. 18. Though the number of circuit devices is greater than that of the load circuit in FIG. 15, variance of the base-emitter voltage is less as the characterizing feature of the bipolar transistor. Since the driving capability is great, it is possible to raise at a high speed the data line voltage that has dropped to V$_{EE}$ by the write operation. Since the variance of the set of the data line voltage is less, there can be obtained the advantage that the difference of the data line pair voltage, that is, the data line signal swing, can be reduced. In this circuit, the bipolar transistors 1803, 1805 and PMOS 1807 are turned OFF in the write cycle while supplying the write instruction signal WE to the node 1801, and the write time can thus be reduced in the same way as the circuit shown in FIG. 15. According to this circuit, the signal swing of the data line is given by the following relational formula from the conduction factor of PMOS 1807. It can be understood that in order to obtain a swing of 20 mV, for example, the effective resistance of PMOS need be 2 Kohms.

$$\left(I_1 - \frac{\Delta V}{R}\right) / \left(I_2 + \frac{\Delta V}{R}\right) = \exp\left(\frac{q\Delta V}{kT}\right)$$

Here, I$_1$ and I$_2$ represent currents flowing through the data lines 1811, 1810 and are hereby assumed to be 50 μA and 10 μA, respectively. R is the effective resistance of PMOS, ΔV is the data line pair voltage difference, q is the charge of electron, k is a Boltzman's constant and T is an absolute temperature. Incidentally, in order to drive the base voltages of the bipolar transistors 1803, 1805, an inverter is disposed in FIG. 18, but it is possible to reverse this combination by applying an inversion signal to the node 1801 so as to drive PMOS 1807 through the inverter or further to control them by connecting respective signals to them.

Figure 19:
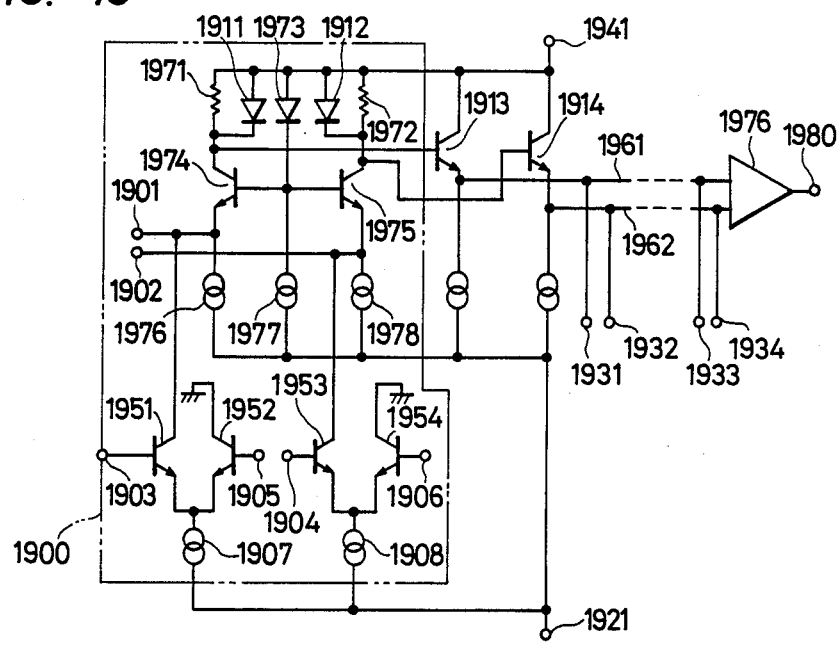
FIGS. 19 and 20 show other examples of sense amplifiers.

FIG. 19 is a structural view showing a modified example of the sense amplifier as the post-stage circuit to the common data lines shown in FIG. 13. In FIG. 13, one pair of inputs are disposed for each of the sense amplifier and the output buffer circuit 1667 for one pair of common data lines. According to such a circuit construction, when the number of memory cells increases beyond 256 K bits, the number of transistor pairs 1645, 1646 to be connected to the common data lines becomes as great as 500 pairs and the parasitic capacitance of the common data lines reaches 20 pF. Therefore, the circuit shown in FIG. 16 involves the problem that when the memory capacity becomes great, the response speed of the common data lines becomes low. The circuit shown in FIG. 19 is advantageous for reducing the parasitic capacitance of the common data lines and for accomplishing the high speed operation. Namely, the circuit of FIG. 19 solves this problem by dividing the common data line into a large number of units, disposing a sense amplifier 1900 and emitter-follower transistors 1913, 1914 for each of the divided common data lines and connecting the emitters of the transistors to the second common data line pair 1961, 1962. Furthermore, there is disclosed a method which sends a predetermined first common data line signal (the inputs from the nodes 1901, 1902 are hereby assumed as the signal) to the second common data lines 1961, 1962 and cuts off other signals.

A reference voltage is supplied to the base 1905, 1906 of the transistor 1952, 1954 in order to detect the signal of the control node 1903, 1904, and the signal is transferred to the output node 1980 by lowering the voltage of the node 1903, 1904 below the reference voltage when transferring the signal node 1901, 1902 from the first common data line to the second common data line 1961, 1962, as described with reference to FIG. 16. On the other hand, when the signal is not sent to the second common data line 1961, 1962, the voltage of the node 1903, 1904 is raised above the reference voltage to extract the current of the constant current source 1907, 1908 from the first common data line to increase the voltage drop of the resistor 1971, 1972 and to cut off the transistor 1913, 1914. It is thus possible to introduce only a predetermined signal of the first common data line signals to the amplifier 1976 by disposing such a circuit for each of the common data line pairs and connecting the emitter of the transistor to the second common data line 1961, 1962. Here, the diodes 1911, 1912 are disposed in order to prevent saturation of the transistors 1974, 1975 when the voltage drop of the resistors 1971, 1972 increases upon connection of the constant current sources 1907, 1908. If the circuit is designed precisely, therefore, these diodes can be eliminated.

When the first common data line is divided into four units in accordance with this circuit, the parasitic capacity of the first common data line is about 5 pF and the response speed becomes four times so that it can be neglected in comparison with the access time of the memory circuit.

Figure 20:
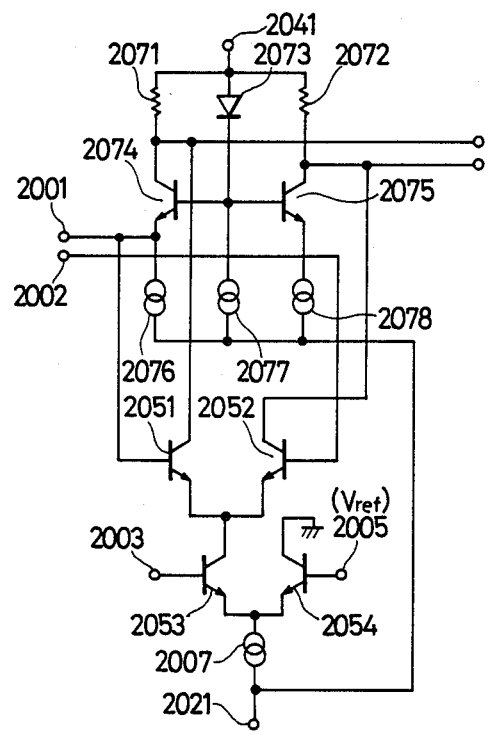

FIG. 20 is a structural view showing a modified example of the sense amplifier shown in FIG. 19. The sense amplifier 1900 encircled by dash line in FIG. 19 can be replaced by the construction shown in FIG. 20.

In the circuit shown in FIG. 19, the current values to be connected to the first common data lines are set to the respective values and the supply of these currents is controlled by the nodes 1903, 1904. According to this circuit arrangement, the voltage drop corresponding to the currents of the nodes 1901, 1902 develop in the resistors 1971, 1972 so that the transistors 1974, 1975 are likely to get into saturation, and clamp diodes must therefore be disposed.

In contrast, in the circuit shown in FIG. 20, the voltage of the first common data line is supplied to the base of the transistor 2051, 2052 of the differential amplifier to detect the current flowing through the transistor 2074, 2075 and the current corresponding to this current is divided into the resistors 2071, 2072. Here, the reference voltage $V_{ref}$ is supplied to the node 2005 while the signal for controlling the supply of the current from the constant current source 2007 to the transistor pair 2051, 2052 is supplied to the node 2003. This circuit eliminates the trouble of saturation of the transistor 2071, 2072 so that the diodes can be eliminated and the number of current source required is only one.

In FIGS. 19 and 20, transfer of the signal to the second common data line 1961, 1962 is cut off by lowering the base voltage of the transistor 1913, 1914 of the emitter follower, but signal transfer can be controlled also by interposing MOSFETs between the bases of the transistors 1913, 1914 and the collectors of the transistors 1974, 1975 and controlling the signal transfer by ON/OFF of MOSFETs. This arrangement provides the advantage that the constant current sources 1907, 1908 and their control circuits can be omitted.

The operation of the circuit shown in FIG. 20 can be accomplished also by using the circuit of FIG. 17 as the sense buffer circuit 1667 shown in FIG. 13 and connecting the collectors of the transistors 1661, 1662 to the input nodes 1751, 1752 shown in FIG. 17, respectively. In other words, when the data of the input nodes 1751, 1752 are transferred to the common data lines 1755, 1756, the gate voltage of the transistor 1759 is raised to supply the current to the differential amplifier without supplying the current to the other differential amplifiers. When the circuit shown in FIG. 17 is used in this manner, only one current source may be disposed for the sense amplifier 1799 in place of the current sources 1907, 1908, 2007 that are required in FIGS. 19 and 20, respectively, and power dissipation can be reduced. In addition, even when the signal swing of the input nodes 1751, 1752 is small, it is sufficiently amplified by the next amplifier so that the memory circuit becomes more resistant to external noise such as the change of the power source.

The following table tabulates the relation of devices that satisfy the condition of the present invention.

TABLE 1

| device | | memory cell | data line load | Y sw | sense amp. |
|---|---|---|---|---|---|
| MOS Resistor Bip JFET | 6 M O S | NMOS | NMOS | NMOS | NMOS + PMOS |
| | | PMOS | PMOS | PMOS | PMOS + NMOS |
| | | CMOS(1) | NMOS | NMOS | Bip Wired |
| | | NMOS, TF | + PMOS(1) | + PMOS | OR |
| | | CMOS(2) | PMOS | PMOS | Common |
| | | PMOS, TF | + NMOS(2) | + NMOS | Collection |
| | | NMOS + Resistor | Resistor | JFET | JFET |
| | 4 M | PMOS + Resistor | Resistor + SW | when not used | |

TABLE 1-continued

| device | circuit | | | |
|---|---|---|---|---|
| | memory cell | data line load | Y sw | sense amp. |
| O | NMOS | Bip | | |
| S | PMOS | | | |
| | | JFET | | |

As described in the foregoing embodiments, the present invention is directed to prevent the occurrence of the change of the node voltage inside the memory cell when reading out the memory data. To accomplish this object, the word line voltage may satisfy the following relationship with the data line voltage:

"The word line voltage is smaller than the sum of the data line voltage and the threshold voltage of data transfer MOS of the memory cell."

Table 1 tabulates the relationship between the device and the memory cells satisfying the condition described above. In other words, the foregoing embodiments represent the memory cell which consists of four NMOs and two resistors, but it can be understood that the resistors may be replaced by PMOSs or NMOSs may be replaced by PMOSs inside the memory cell.

Table 2 tabulates the applicable range of the devices shown in Table 1 from the condition of the power source voltage to be supplied to the memory circuit. Incidentally, the power source includes also the voltage that is generated inside LSI.

circuits can be applied to the Y switch and the sense amplifier.

When a power source is disposed which supplies a positive voltage higher than $V_{CC}$, all the devices and circuits can be applied to the data line load, the Y switch and the sense amplifier.

Tables 1 and 2 can be applied to the circuit system which supplies the negative voltage, on the contrary, and the polarity of devices constituting the memory cells and the like must be reversed by replacing NMOS by PMOS, for example.

As described above, the present invention stipulates the relationship between the word line voltage and the data line voltage in such a manner that the former must be smaller than the sum of the latter and the threshold voltage of the data transfer MOS of the memory cell, and can thus prevent the change of the node voltage of the memory cell with the read operation of the memory data. Accordingly, the present invention can drastically improve the memory data storage characteristics, particularly the reduction of the soft error rate.

TABLE 2

| | word line voltage read cycle/ write cycle | data line load | | | Y switch | | sense amplifier | |
|---|---|---|---|---|---|---|---|---|
| when power source above $V_{cc}$ is disposed | $V_{cc}/V_{cc}$ | PMOS Bip NMOS(D) | { | opposite polarity | $V_{cc}$ | PMOS, not used PMOS + NMOS | Bip- CMOS JFET | { Common Collection EF Wired OR |
| | $V_{cc} - \alpha/V_{cc}$ | PMOS Bip NMOS JFET | | | | combination with all devices can be used | combination with all devices can be used | |
| when power source above $V_{cc}$ is not disposed | $V_{cc}/V_{cc+\beta}$ $V_{cc-\alpha}/V_{cc+\beta}$ $V_{cc+\beta}/V_{cc+\beta}$ | combination with all devices can be used | | | $V_{cc} + \gamma$ when not used | | | |

The table given above illustrates that when the supply of a voltage higher than the positive voltage $V_{CC}$ supplied from outside does not exist, the word line voltage must be up to $V_{CC}$. When the word line voltage is $V_{CC}$, the devices that can be used as the data line load include PMOS and the bipolar transistor, and when NMOS is used, it must have a threshold voltage lower than the threshold voltage of data transfer NMOS inside the memory cell. When the word line voltage is set to a level lower than $V_{CC}$, on the other hand, there no longer exists the limit of the threshold voltage of NMOS and a junction FET can also be used for data transfer. Furthermore, a limitation occurs in the circuit in which the word line voltage becomes $V_{CC}$, in the switch circuit from the data line to the common data line, PMOS, and parallel connection of PMOS and NMOS or a switch circuit must not be used in such a case. The same limitation is imposed on the circuit system of the sense amplifiers, and the circuits are limited to the emitter follower circuit of bipolar transistors, the common collector circuit or the differential amplifier using CMOS, JFET. When the word line voltage is lower than $V_{CC}$, on the other hand, all the devices and It is further understood by those skilled in the art that the foregoing description is preferred embodiments of the disclosed device and that various changes and modifications may be made in the invention without departing from the spirit and scope thereof.

What is claimed is:

1. A semiconductor memory comprising:
   a plurality of pairs of data lines;
   a plurality of word lines orthogonally crossing said data lines; and
   a detection circuit for detecting memory data from a conduction ratio between a transistor of a flip-flop type memory cell, which is connected to one of said word lines and one pair of said plurality of pairs of data lines, and a load device which is connected to one data line of said one pair of said data lines,
   wherein the voltage of said word line for reading out said memory data from said flip-flop type memory cell is set to a voltage lower than the sum of the voltage of said data line and the threshold voltage of a data transfer MOS transistor of said memory cell, and a signal read out from said memory cell through said data line is inputted to a differential amplifier using a base or gate of a junction type transistor as its input.

2. A semiconductor memory according to claim 1, wherein in order to set said word line voltage to a voltage lower than the sum of said data line voltage and the threshold voltage of said data transfer MOS transistor of said memory cell, a device having high driving capability is used as the load of said data line, and wherein said word line voltage is changed over to two stages so that the relationship between said data line voltage $V_D$ and said word line voltage $V_W$ satisfy the relation $V_W < V_D + V_{TH}$ in the read cycle and the relation $V_W > V_D + V_{TH}$ in the write cycle (where $V_{TH}$ is the threshold value of NMOS inside said memory cell).

3. A semiconductor memory according to claim 1, further comprising first common data lines disposed in common for a plurality of said data lines, wherein an emitter or source (drain) of said junction type transistor is connected to each of said first common data line.

4. A semiconductor memory according to claim 3, wherein said data lines and said word lines constitute a plurality of memory arrays, and said first common data lines are connected in common to said data lines existing inside one of said memory arrays.

5. A semiconductor memory according to claim 4, further comprising second common data lines disposed in common on said first common data lines, wherein memory data are read out from said second common data lines.

6. A semiconductor memory comprising:
a plurality of pairs of data lines;
a plurality of word lines orthogonally crossing said data lines;
word drivers for driving said word lines; and
a detection circuit for detecting memory data from a conduction ratio between a transistor of a flip-flop type memory cell, which is connected to one of said word lines and one pair of said plurality of pairs of data lines, and a load device which is connected to one data line of said one pair of said data lines,
wherein the voltage of said word line for reading out said memory data from said flip-flop type memory cell is set to a voltage lower than the sum of the voltage of said data line and the threshold voltage of a data transfer MOS transistor of said memory cell, wherein a switch circuit is disposed on said data line pair to share a differential amplifier by an ON/OFF operation of said switch circuit, and wherein emitters of a plurality of level-shifting emitter followers are connected in parallel with one another and led to said differential amplifier.

7. A semiconductor memory according to claim 6, wherein in order to set said word line voltage to a voltage lower than the sum of said data line voltage and the threshold voltage of said data transfer MOS transistor of said memory cell, a device having high driving capability is used as the load of said data line, and wherein said word line voltage is changed over to two stages so that said data line voltage $V_D$ and said word line voltage $V_W$ satisfy the relation $V_W < V_D + V_{TH}$ in the read cycle and the relation $V_W > V_D + V_{TH}$ in the write cycle (where $V_{TH}$ is the threshold value of NMOS inside said memory cell).

8. A semiconductor memory according to claim 6, further comprising first common data lines disposed in common for a plurality of said data lines, wherein an emitter or source (drain) of said junction type transistor is connected to each of said first common data line.

9. A semiconductor memory according to claim 8, wherein said data lines and said word lines constitute a plurality of memory arrays, and said first common data lines are connected in common to said data lines existing inside one of said memory arrays.

10. A semiconductor memory according to claim 9, further comprising second common data lines disposed in common on said first common data lines, wherein memory data are read out from said second common data lines.

* * * * *